United States Patent

Choi

Patent Number: 5,950,109
Date of Patent: Sep. 7, 1999

[54] METHODS OF DEPOSITING FILMS ON SEMICONDUCTOR WAFERS USING PARTIAL DEPOSITION AND RELOADING TECHNIQUES

[75] Inventor: Jin-bang Choi, Kyonggi-do, Rep. of Korea

[73] Assignee: Samsung Electronics Co., Ltd., Rep. of Korea

[21] Appl. No.: 08/825,118

[22] Filed: Mar. 27, 1997

[30] Foreign Application Priority Data

Oct. 24, 1996 [KR] Rep. of Korea ........................ 96-48017

[51] Int. Cl.$^6$ .................................................. H01L 21/31
[52] U.S. Cl. ........................ 438/761; 438/763; 438/907; 438/908; 427/99
[58] Field of Search .................................... 438/907, 908, 438/761, 763; 427/99; 118/715

[56] References Cited

U.S. PATENT DOCUMENTS

| | | |
|---|---|---|
| 5,135,608 | 8/1992 | Okutani . |
| 5,217,340 | 6/1993 | Harada et al. . |
| 5,668,056 | 9/1997 | Wu et al. . |
| 5,683,940 | 11/1997 | Yahiro . |
| 5,747,381 | 5/1998 | Wu et al. . |

FOREIGN PATENT DOCUMENTS

| | | |
|---|---|---|
| 0 502 412 A1 | 9/1992 | European Pat. Off. . |
| 0 532 758 A1 | 3/1993 | European Pat. Off. . |

*Primary Examiner*—Richard Booth
*Assistant Examiner*—Jonathan Hack
*Attorney, Agent, or Firm*—Myers Bigel Sibley & Sajovec

[57] ABSTRACT

Methods of depositing films on semiconductor wafers include the steps of loading a deposition apparatus with a first plurality of semiconductor wafers from a first run cassette and then depositing a first material such as undoped silica glass (USG) or borophosphosilicate glass (BSPG), for example, thereon. After a first film has been completely deposited on each of the loaded wafers, a first wafer in the first plurality is removed from the apparatus and another wafer from the first run cassette is loaded into the apparatus. A second film of the first material is then deposited on the remaining first plurality of wafers and the added wafer. Following this deposition step, a second wafer from the first plurality is removed from the apparatus and another wafer (e.g., seventh wafer) from the first run cassette is loaded into the apparatus. If this deposition apparatus has N dispersion heads, the above sequence of steps will be repeatedly performed at least until all the wafers from the first run cassette have been loaded and the Nth and higher wafers from the first run cassette have received a composite film deposited thereon which has the desired final thickness. However, after the last wafer from the last run cassette has been loaded, the first, second, . . . , and N–1 wafers from the first run cassette are reloaded back into the apparatus and additional deposition steps are performed so that additional intermediate films may be deposited on the reloaded wafer. Then, once the last wafer from the last run cassette has undergone a final deposition step in the apparatus, the deposition steps are terminated and the last wafer from the last run cassette and the first, second, . . . , and N–1 wafers from the first run cassette are unloaded from the apparatus.

15 Claims, 13 Drawing Sheets

METHODS OF DEPOSITING FILMS ON SEMICONDUCTOR WAFERS USING PARTIAL DEPOSITION AND RELOADING TECHNIQUES

FIELD OF THE INVENTION

The present invention relates to semiconductor fabrication methods, and more particularly to methods of depositing layers of material on semiconductor wafers.

BACKGROUND OF THE INVENTION

Figure 1:
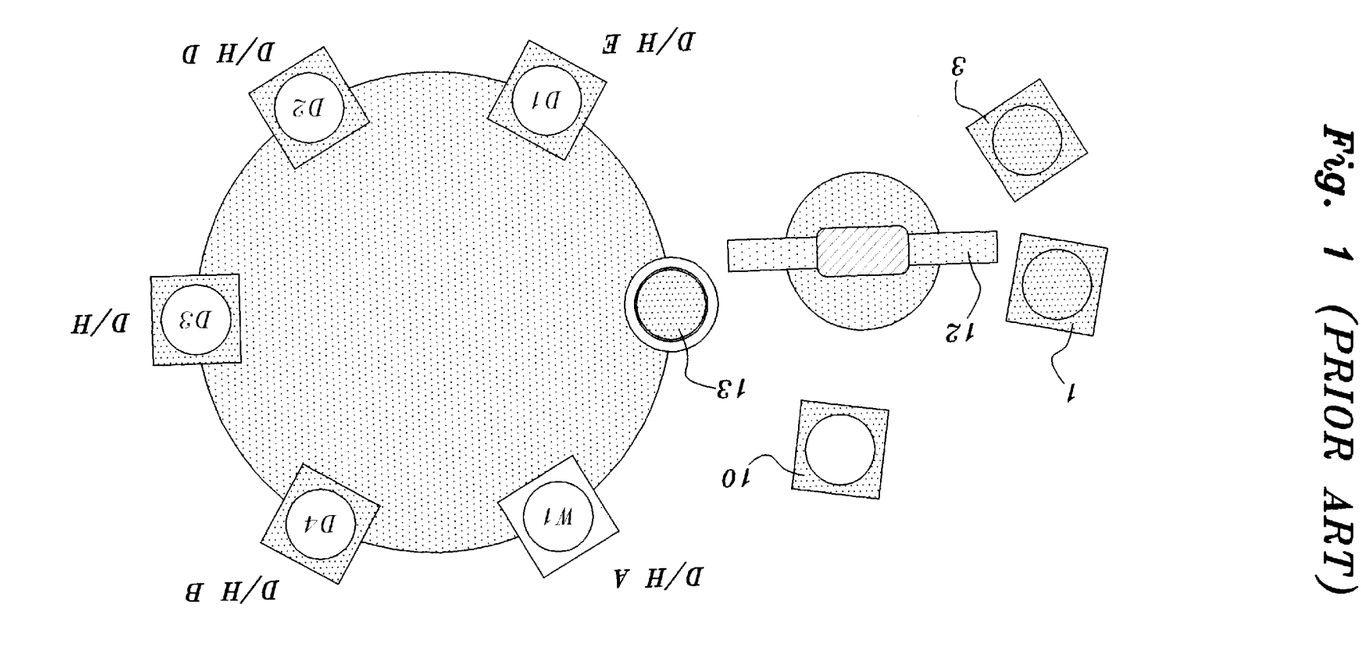
FIG. 1 illustrates a schematic view of a conventional deposition apparatus in an initial loaded state which reflects a step in a conventional method of forming films on semiconductor wafers.
Figure 2:
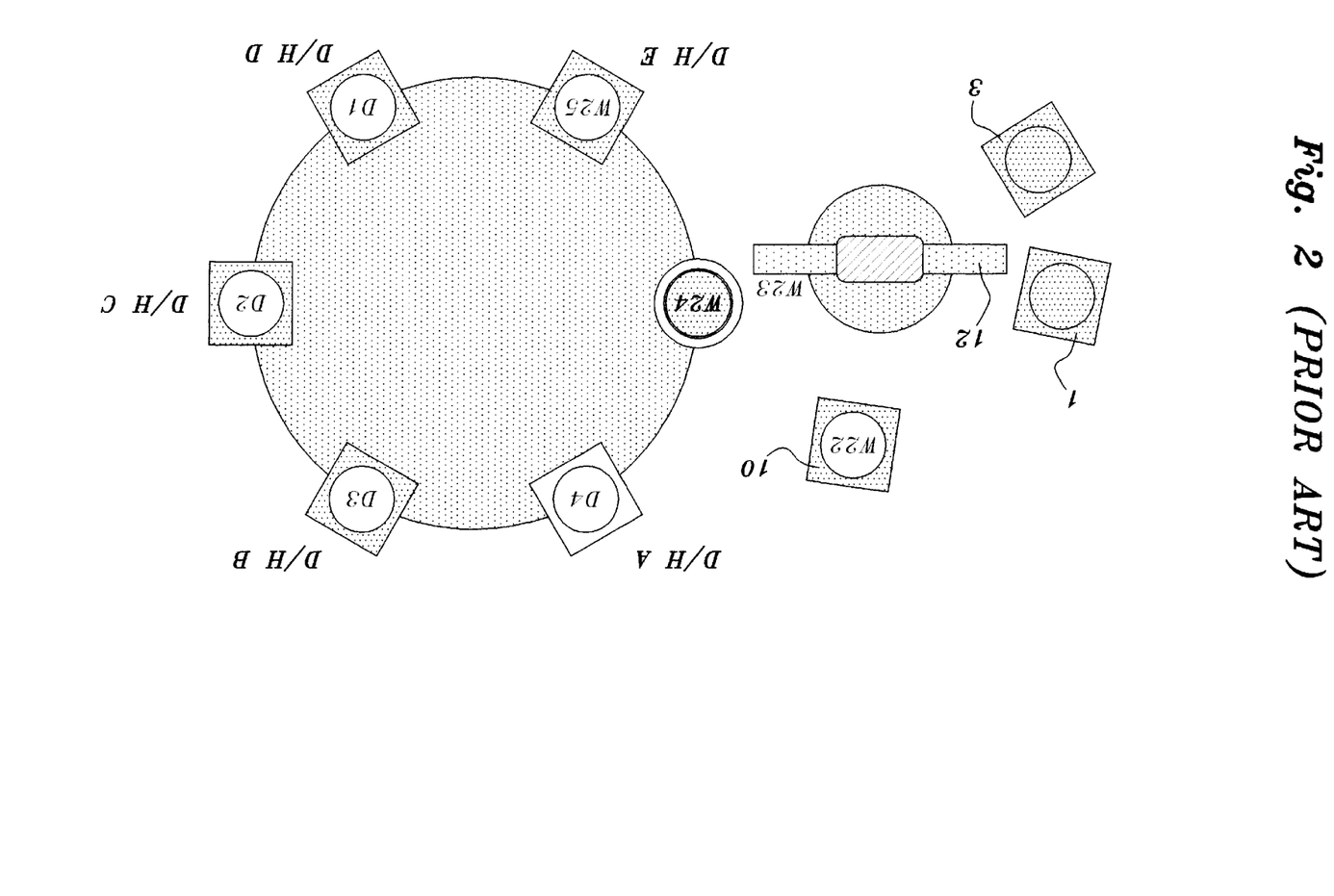
FIG. 2 illustrates a schematic view of a conventional deposition apparatus in a final loaded state which reflects a step in a conventional method of forming films on semiconductor wafers.

CVD film forming processes are generally accomplished with all dispersion heads (D/Hs) filled with wafers, in the manner that a wafer to be deposited is loaded on each D/H. This is depicted in FIG. 1 and FIG. 2. In the event there are five D/Hs in a chamber, dummy wafers D1–D4 are moved from a dummy wafer cassette 1 to an elevator successively using a cold arm 12 and are loaded on each D/H E–B using a load susceptor 13. Then, a first slot wafer W1 is moved from a run cassette 3 to the elevator and is loaded on D/H A. Consequently, all five D/Hs are loaded with wafers. This is an initial wafer loading step and is shown in FIG. 1.

The wafer loading step is followed by a CVD processing step for depositing a material of predetermined thickness on the wafers. The thickness of material deposited in each step in the deposition process is determined by the quotient of 100% divided by the number of the D/Hs on the supposition that the thickness to be finally obtained is 100%. That is to say, the thickness to be obtained by a deposition process is 100%/5=20% in the above embodiment. After an initial CVD deposition step, the wafers in the chamber are moved to the next D/Hs. At this time, the first loaded dummy wafer is unloaded from D/H E through the elevator and a second slot wafer is loaded from the run cassette 3. If the steps of depositing films on the wafers, moving the wafers to the next D/Hs, unloading the wafer moved onto D/H E and loading a new slot wafer on D/H A are repeated, the dummy wafers D1–D4 which are unloaded will have received only 20%, 40%, 60% and 80% of the material deposited on the slot wafers, respectively. The unloaded wafers including the dummy wafers D1–D4 stay at a cooling station 10 for approximately 30 minutes and are stored in their respective original positions in the cassettes 1, 3. In such manner, deposition on all of the wafers in the run cassette 3 is completed.

In the case of a run cassette 3 with 25 wafers, the deposition process is executed with a 25th slot wafer loaded on the D/H A. When the deposition process is completed, the wafers are moved to the next D/Hs. Here, a 21st slot wafer (loaded on D/H E) is unloaded through the elevator. Since there are no more slot wafers left in the run cassette at this time, the unloaded dummy wafers are then reloaded on the D/Hs A–D as the 25th slot wafer moves from D/H A to D/H E. The case where D/H E is occupied by the 25th slot wafer is illustrated by FIG. 2. This is followed by a clean-up process and the cleaned wafers are then unloaded.

Unfortunately, this conventional method has several limitations. First, it requires the use of dummy wafers which may be in short supply if high wafer reliability, which is desired, is achieved. In addition, dummy wafers typically need to be changed in a range between about once a week and once every three weeks. Second, dummy wafers may be prone to cracking and particles generated by cracked dummy wafers may contaminate other wafers during processing and reduce wafer yield and reliability. Third, the use of dummy wafers limits that ability to achieve continuous processing of wafers because the steps of using dummy wafers must be controlled by a human operator instead of by computer. This reduces efficiency and increases cost.

Thus, notwithstanding the above described method which requires the use of dummy wafers, there continues to be a need for improved methods of depositing films on semiconductor wafers.

SUMMARY OF THE INVENTION

It is therefore an object of the present invention to provide improved methods of depositing films on semiconductor wafers.

It is another object of the present invention to provide methods of depositing films on semiconductor wafers which do not require the use of dummy wafers to fill unused dispersion heads.

These and other objects, features and advantages of the present invention are provided by methods of depositing films on a plurality of semiconductor substrates which eliminate the need to use dummy wafers and allow the repeated and continuous loading of sets of active wafers into a deposition apparatus so that composite films having a final desired thickness can be deposited thereon. According to one embodiment of the present invention, a chemical vapor deposition apparatus is loaded with a first plurality of semiconductor substrates (e.g., 5 wafers) from a first run cassette and then a first material such as undoped silica glass (USG) or borophosphosilicate glass (BSPG), for example, is deposited as a first film on each of the loaded substrates. Here, the substrates may be loaded on respective dispersion heads within the apparatus and the thickness of the first film is typically equal to the final desired thickness divided by the number of dispersion heads in the apparatus.

After a first film has been completely deposited on each of the loaded substrates, a first substrate in the first plurality is removed from the apparatus and another substrate (e.g., sixth wafer) from the first run cassette is loaded into the apparatus. A second film of the first material is then deposited on the remaining first plurality of substrates and the added substrate. This second film is typically deposited to the same thickness as the first film. Following this deposition step, a second substrate from the first plurality is removed from the apparatus and another substrate (e.g., seventh wafer) from the first run cassette is loaded into the apparatus. At the time of removal, the second substrate will have a composite film thereon having twice the thickness of the film on the previously removed first substrate. If this deposition apparatus has N dispersion heads (e.g., 5), the above sequence of steps will be repeatedly performed at least until all the substrates from the first run cassette have been loaded and the Nth and higher substrates from the first run cassette have received a composite film deposited thereon which has the desired final thickness.

After the last substrate in the first run cassette has been loaded and a respective first deposition step has been performed on the last substrate, substrates from a second run cassette may then be loaded in sequence until each receives a composite film of the desired thickness thereon and is unloaded back into the second run cassette. Additional run cassettes may also be provided and the above steps repeated. However, after the last substrate from the last run cassette has been loaded, the first, second, . . . , and N−1 substrates from the first run cassette are reloaded back into the apparatus and additional deposition steps are performed so that additional intermediate films may be deposited on the reloaded substrate. Then, once the last substrate from the last run cassette has undergone a final deposition step in the apparatus, the deposition steps are terminated and the last substrate from the last run cassette and the first, second, . . ., and N−1 substrates from the first run cassette are unloaded from the apparatus. Accordingly, using the above described steps, it is unnecessary to use dummy wafers in the first, second, . . . , and N−1 dispersion heads at the commencement of a deposition run since the first, second, . . . , and N−1 substrates from the first run cassette can be used instead and then reloaded at a later point in time to receive final processing.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 3A:
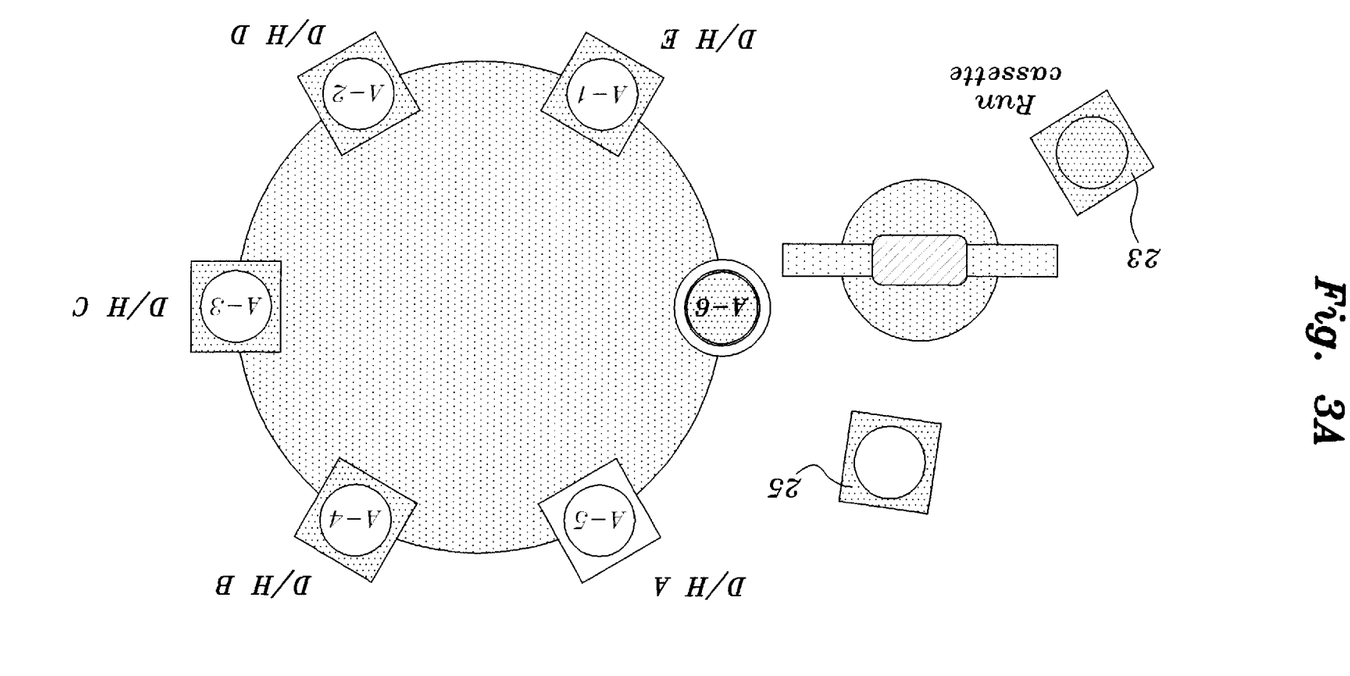
FIG. 3A illustrates a schematic view of a conventional deposition apparatus in an initial loaded state which reflects one step in a method of forming films on semiconductor wafers according to a first embodiment of the present invention.
Figure 4:
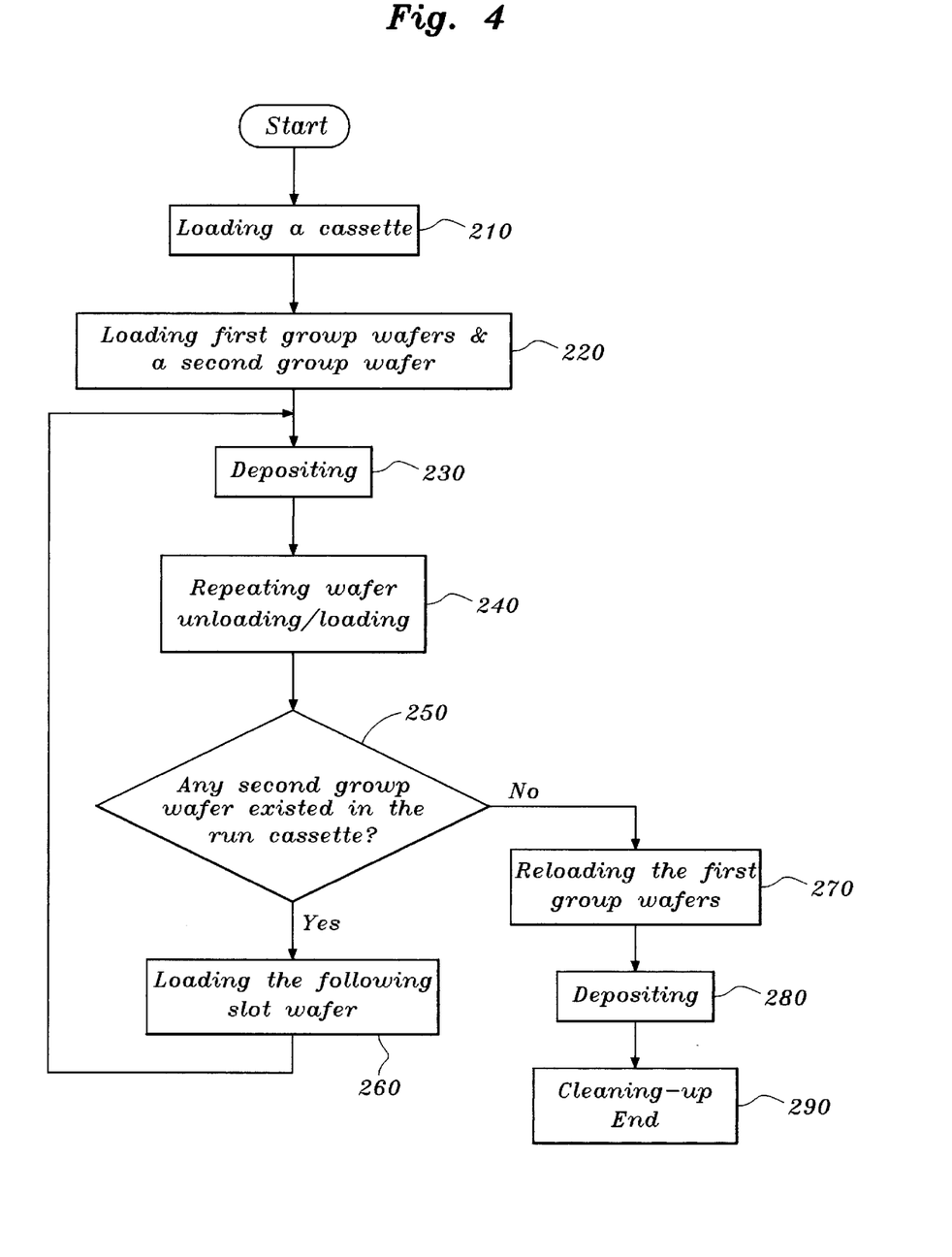
FIG. 4 is a flow diagram illustrating steps performed in accordance with a method of forming films on substrates according to a first embodiment of the present invention.

Referring now to FIGS. 3A–3B and FIG. 4, a first embodiment of a preferred method of forming films on a plurality of semiconductor substrates will be described. In particular, FIG. 3A illustrates a schematic view of a conventional deposition apparatus in an initial loaded state. As illustrated by Block 210 of FIG. 4, a run cassette 23 containing a plurality of semiconductor wafers (e.g., 25 wafers) is initially provided. In the event the deposition apparatus has five dispersion heads (D/HA–D/HE) as illustrated, then the first four wafers A1–A4 from the run cassette 23 are loaded into the second, third, fourth and fifth dispersion heads D/HB–D/HE, as illustrated. The fifth wafer A5 from the run cassette 23 is also loaded into the first dispersion head D/HA. These steps are illustrated by Block 220 in FIG. 4 where the first four wafers constitute first group wafers and the fifth wafer constitutes a second group wafer. At this time, a sixth wafer A6 from the run cassette 23 is carried by an elevator and is ready to be loaded the first dispersion head D/HA. As illustrated by Block 230, a step is then performed to deposit a film of predetermined thickness on each of the loaded wafers. In this embodiment, the thickness of the deposited film is 20% of the final desired thickness (i.e., the quotient of 100% divided by the number of dispersion heads D/H in the apparatus).

Referring now to Block 240, after each deposition step the wafers are moved to the next D/Hs according to the susceptor movements. Then, the first wafer A1 is unloaded by the elevator and placed at the cooling station 25 for about 30 minutes before being stored back into the run cassette 23. At this time, the thickness of the film on the first wafer is 20% of the final desired thickness. The sixth wafer A6 is also loaded into the first dispersion head D/HA and another deposition step is then carried out. At this point in time, the sixth wafer A6 will have film thereon which has a thickness equal to 20% of the thickness of the final desired film, but the second-fifth wafers A2–A5 will have a thickness equal to 40% of the thickness of the final desired film. Then, the second wafer A2 is unloaded by the elevator and placed at the cooling station 25 for about 30 minutes before being stored back into the run cassette 23. As illustrated by Blocks 250–260, these loading, depositing and unloading steps are repeatedly performed in sequence until all of the wafers from a respective run cassette have been loaded into the apparatus. Once all the wafers have been loaded, the decision made by Block 250 will be "no" and the first wafer A1 will be loaded into the elevator. The first wafer A1 will then be loaded onto the first dispersion head D/HA after the last wafer (e.g., A25) has undergone a deposition step. In addition, as the last wafer A25 undergoes subsequent deposition steps, the second, third and fourth wafers A2–A4 are reloaded so that additional films can be deposited thereon, Blocks 270–280.

Figure 3B:
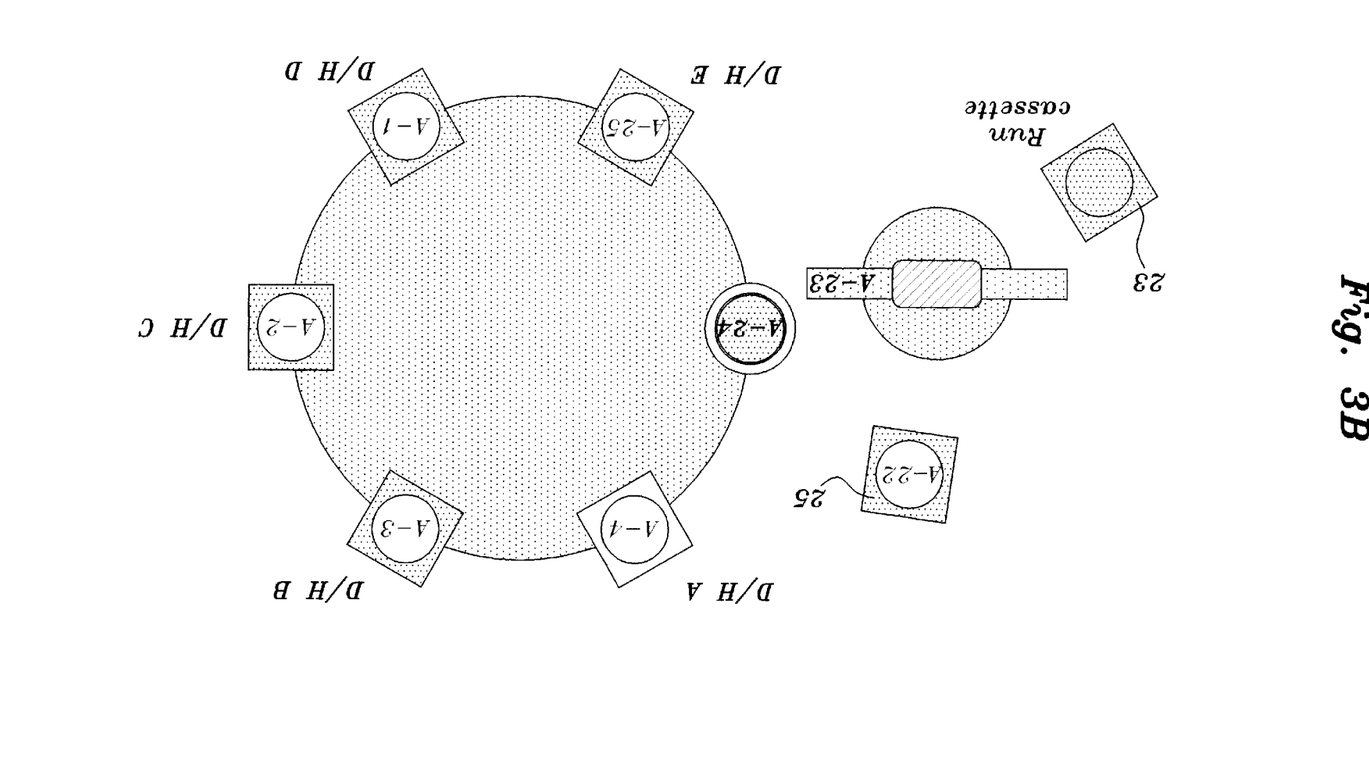
FIG. 3B illustrates a schematic view of a conventional deposition apparatus in a final loaded state which reflects another step in a method of forming films on semiconductor wafers according to a first embodiment of the present invention.

As illustrated by FIG. 3B, the process is complete when the last wafer A25 undergoes a final deposition step in the fifth dispersion head D/HE. Thus, the first wafer A1 receives 20% of its composite film after the initial loading step and the remaining 80% after being reloaded. Similarly, the second wafer A2 receives 40% of its composite film after the initial loading step and the remaining 60% after being reloaded; the third wafer A3 receives 60% of its composite film after the initial loading step and the remaining 40% after being reloaded; and the fourth wafer A4 receives 80% of its composite film after the initial loading step and the remaining 20% after being reloaded. The wafers are then removed and a cleaning step is performed, Block 290.

Accordingly, the above described embodiment of the present invention includes the steps of loading an apparatus (e.g., CVD deposition chamber having 5 dispersion heads D/HA–D/HE therein) with a first plurality of semiconductor substrates (e.g., A1–A5) from a run cassette, depositing a first film of a first material (e.g., undoped silica glass, borophosphosilicate glass) on each of the first plurality of substrates and then removing a first substrate (e.g., A1) in the first plurality thereof from the apparatus. A second film of the first material is then deposited on the first plurality of substrates which have not been removed from the apparatus (e.g., A2–A5) so that these substrates include a composite of the first and second films thereon. As described above, the composite of the first and second films may have a thickness which is 40% of the final desired thickness of the final composite layer of deposited material. The second substrate (e.g., A2) is then removed from the deposition apparatus and then the loading and deposition steps are repeatedly performed until all the substrates from the run cassette have been processed. Then, the first, second, third and fourth substrates (A1–A4) are reloaded in sequence after the last substrate from the run cassette has been loaded and received a first deposition film. The method is then terminated when the last substrate from the run cassette has been processed in the last dispersion head D/HE and the first, second, third and fourth reloaded substrates have been fully processed at the fourth, third, second and first dispersion heads D/HD–D/HA, respectively.

Figure 5A:
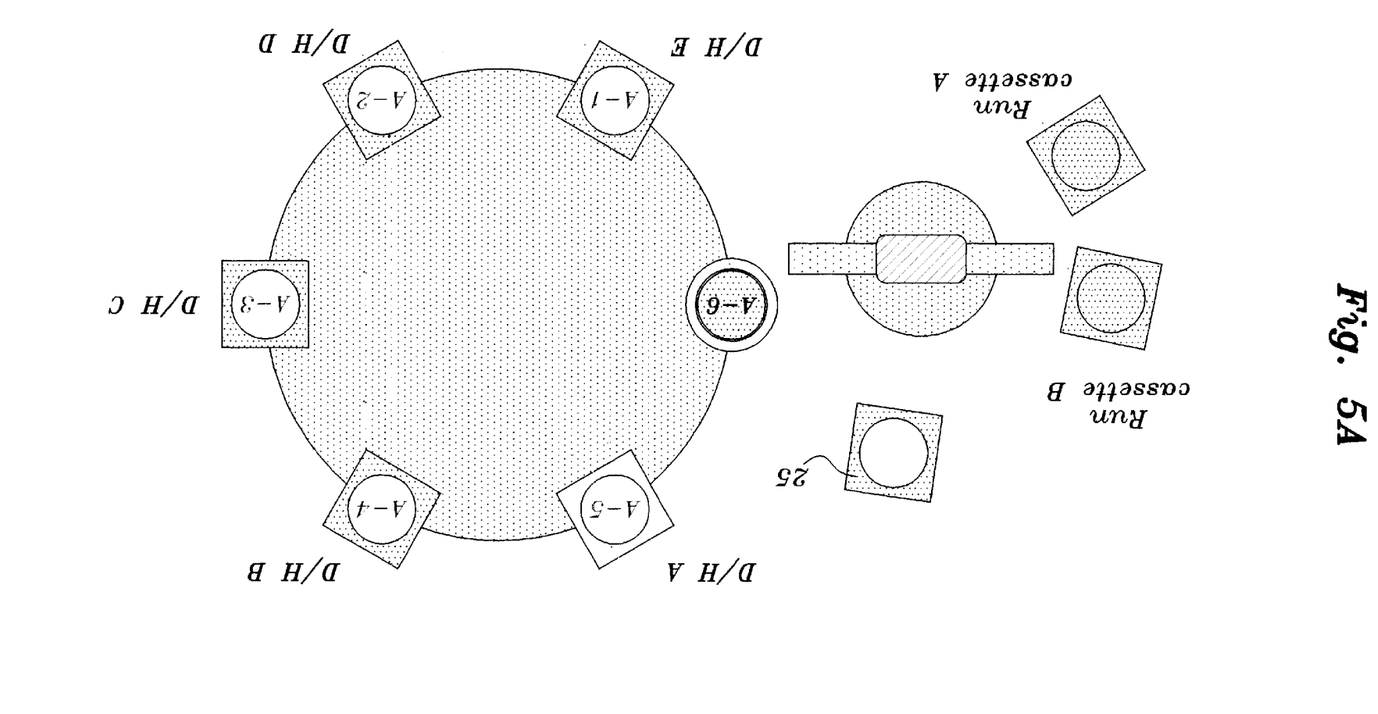
FIG. 5A illustrates a schematic view of a conventional deposition apparatus in an initial loaded state which reflects one step in a method of forming films on semiconductor wafers according to a second embodiment of the present invention.
Figure 5B:
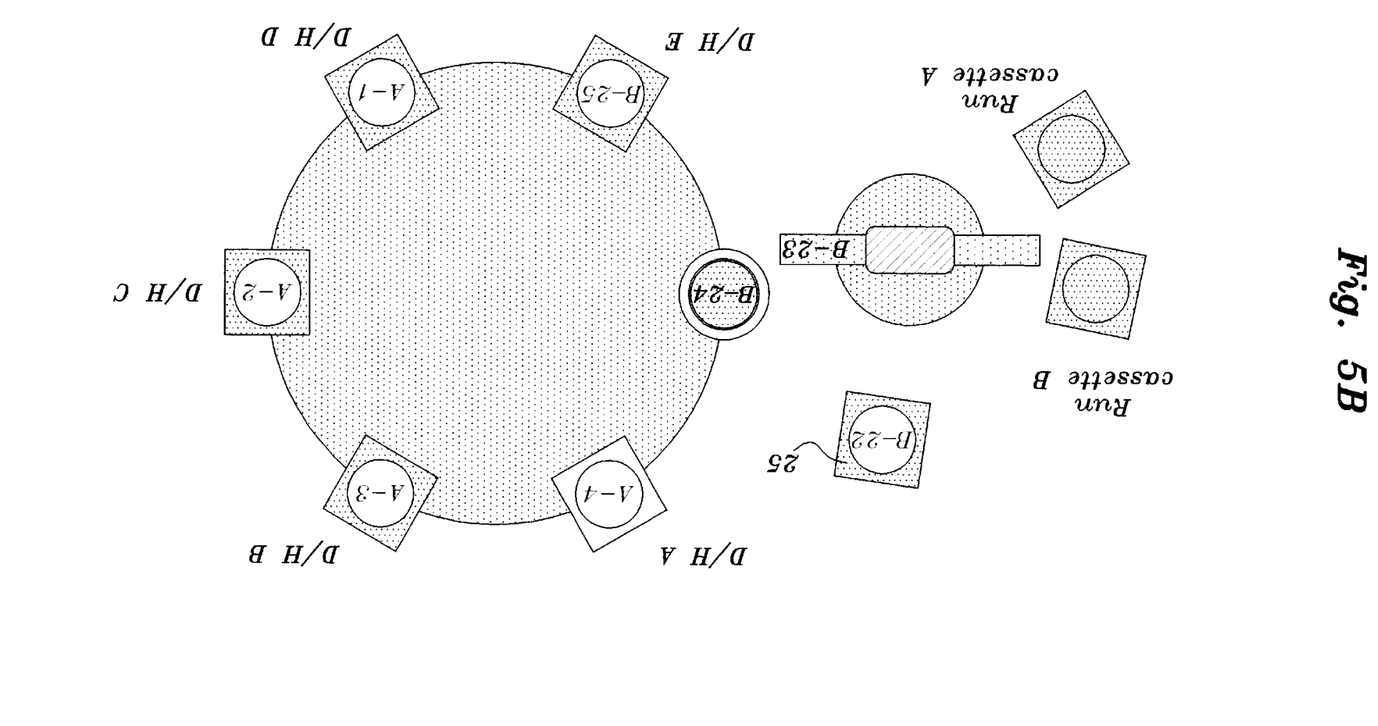
FIG. 5B illustrates a schematic view of a conventional deposition apparatus in a final loaded state which reflects another step in a method of forming films on semiconductor wafers according to a second embodiment of the present invention.
Figure 6:
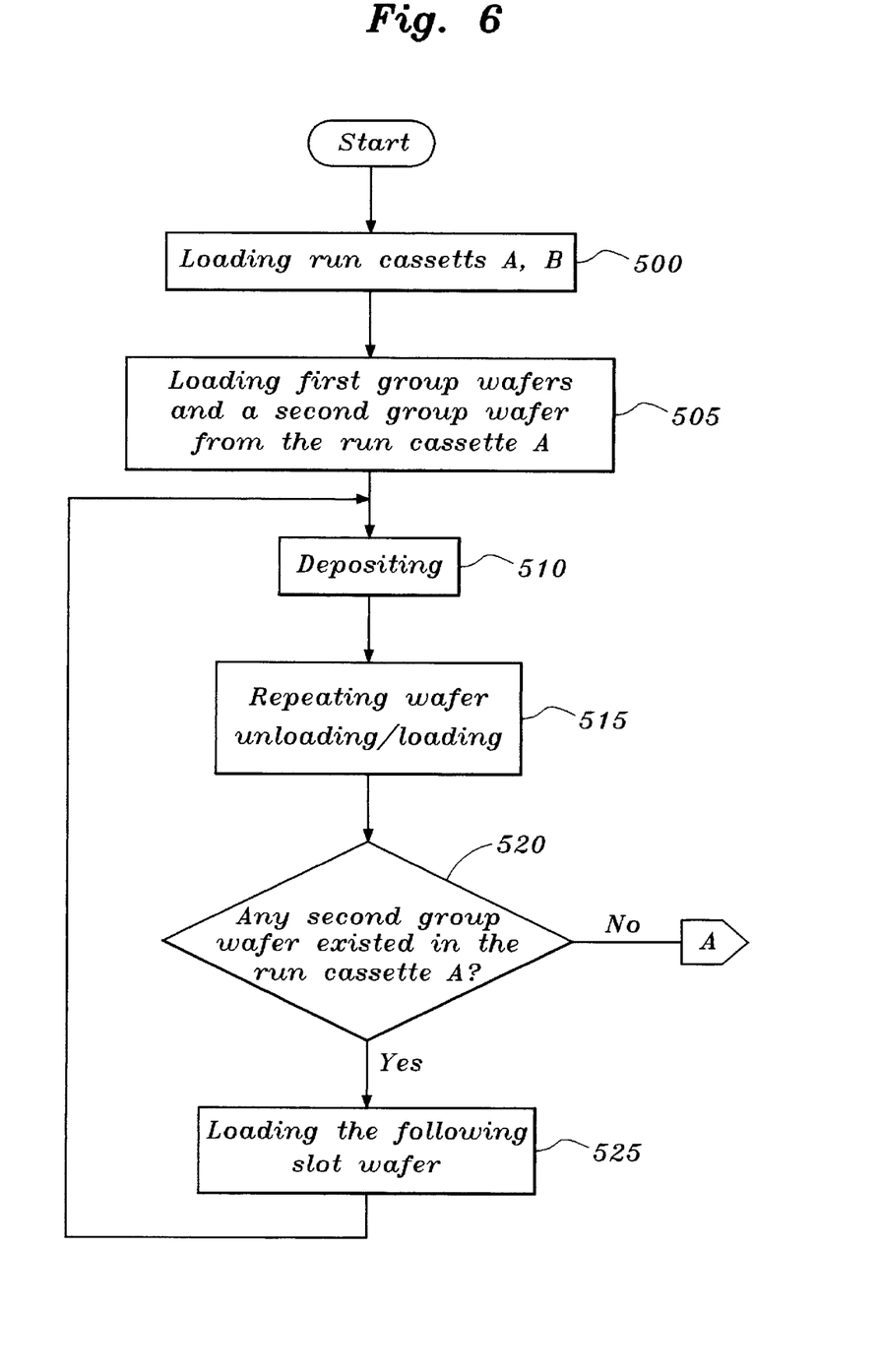
FIG. 6 is a flow diagram illustrating steps performed in accordance with a method of forming films on substrates according to a second embodiment of the present invention.

Referring now to FIGS. 5A–5B and 6, a second embodiment of a preferred method of forming films on a plurality of semiconductor substrates will be described. The second embodiment is similar to the above described first embodiment, however, two run cassettes of wafers are provided and the step of reloading of the first group wafers is delayed until after all the wafers from the second run cassette have been loaded and at least partially processed. In particular, FIG. 5A is similar to FIG. 3A, however, run cassette A and run cassette B are provided adjacent the cooling station 25. FIG. 5B is also similar to FIG. 3B, however, reloading and final processing of the first group of wafers (A1–A4) does not occur until after the last wafer (e.g., B25) from run cassette B undergoes final processing in the last dispersion head D/HE. As illustrated best by FIG. 5B, at the time of final processing of the last wafer from run cassette B. wafers 22–24 will be positioned at the cooling station 25, transporter and elevator, respectively. Referring now to FIG. 6 which is a flow diagram illustrating steps performed in accordance with a method of forming films on substrates according to a second embodiment of the present invention, the steps of Blocks 500, 505, 510, 515, 520 and 525 are similar to the steps 210, 220, 230, 240, 250 and 260, respectively, of FIG. 4. However, as illustrated by Block 530, the first group wafers from run cassette A are only reloaded (Block 550) after all the wafers in run cassette B have been loaded and at least partially processed. In other words, the steps of Blocks 525, 510 and 515 (corresponding to run cassette A) are repeated as the steps of Blocks 535, 540 and 545 for the wafers in run cassette B. Reloading and processing of the first group wafers, Blocks 550 and 555, then commences after the last wafer in run cassette B has been processed in the first dispersion head D/HA. The last wafer from run cassette B and the first four wafers from run cassette A are then removed and a cleaning step is performed, Block 560.

Figure 7A:
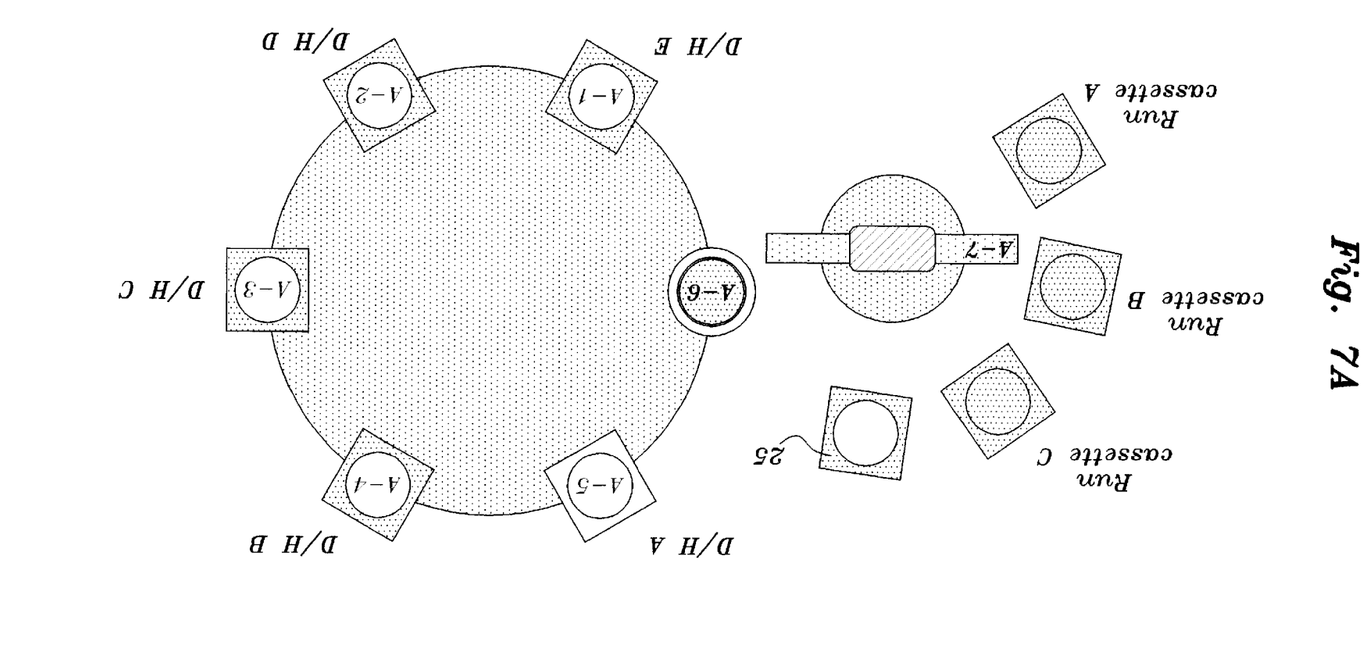
FIG. 7A illustrates a schematic view of a conventional deposition apparatus in an initial loaded state which reflects one step in a method of forming films on semiconductor wafers according to a third embodiment of the present invention.
Figure 7B:
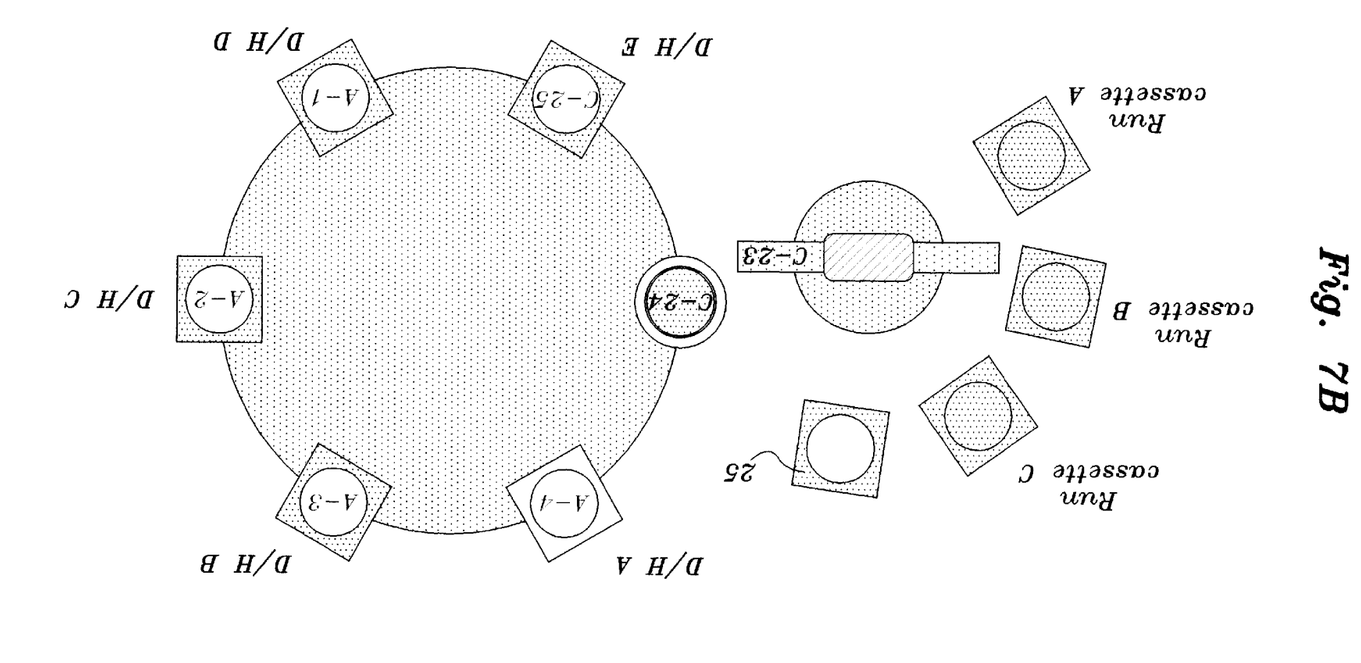
FIG. 7B illustrates a schematic view of a conventional deposition apparatus in a final loaded state which reflects another step in a method of forming films on semiconductor wafers according to a third embodiment of the present invention.

Referring now to FIGS. 7A–7B, a third embodiment of a preferred method of forming films on a plurality of semiconductor substrates will be described. The third embodiment is similar to the above described first and second embodiments, however, three run cassettes of wafers are provided and the step of reloading first group wafers is delayed until after all the wafers from the third run cassette have been loaded and at least partially processed. In particular, FIG. 7A is similar to FIG. 5A, however, run cassettes A, B and C are provided adjacent the cooling station 25. FIG. 7B is also similar to FIG. 5B, however, reloading and final processing of the first group of wafers (A1–A4) does not occur until the last wafer (e.g., C25) from run cassette C undergoes final processing in the last dispersion head D/HE. As illustrated best by FIG. 7B, at the time of final processing of the last wafer from run cassette C (e.g., C25), wafers C22–C24 will be positioned at the cooling station 25, transporter and elevator, respectively. Thus, according to this third embodiment, two cassettes of wafers can be fully processed before the wafers in run cassette A are fully processed.

Figure 8A:
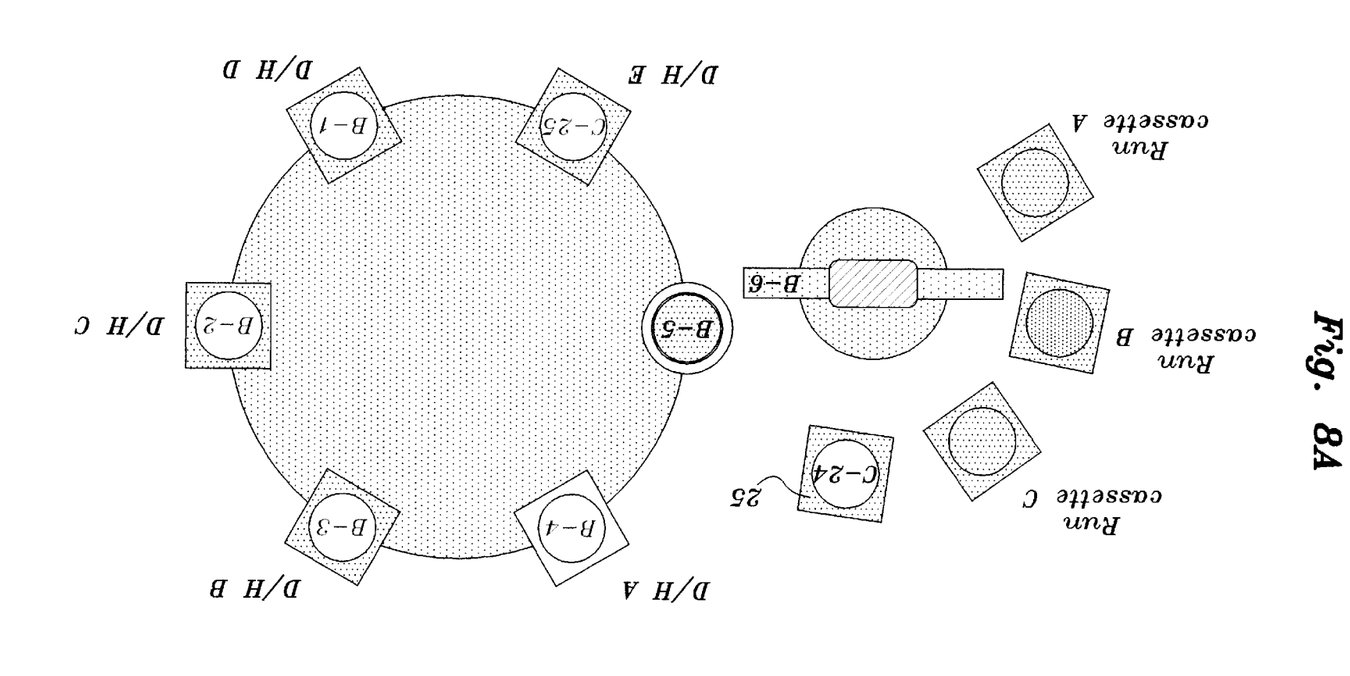
FIG. 8A illustrates a schematic view of a conventional deposition apparatus in a final loaded state which reflects a step in a method of forming films on semiconductor wafers according to a fourth embodiment of the present invention.
Figure 8B:
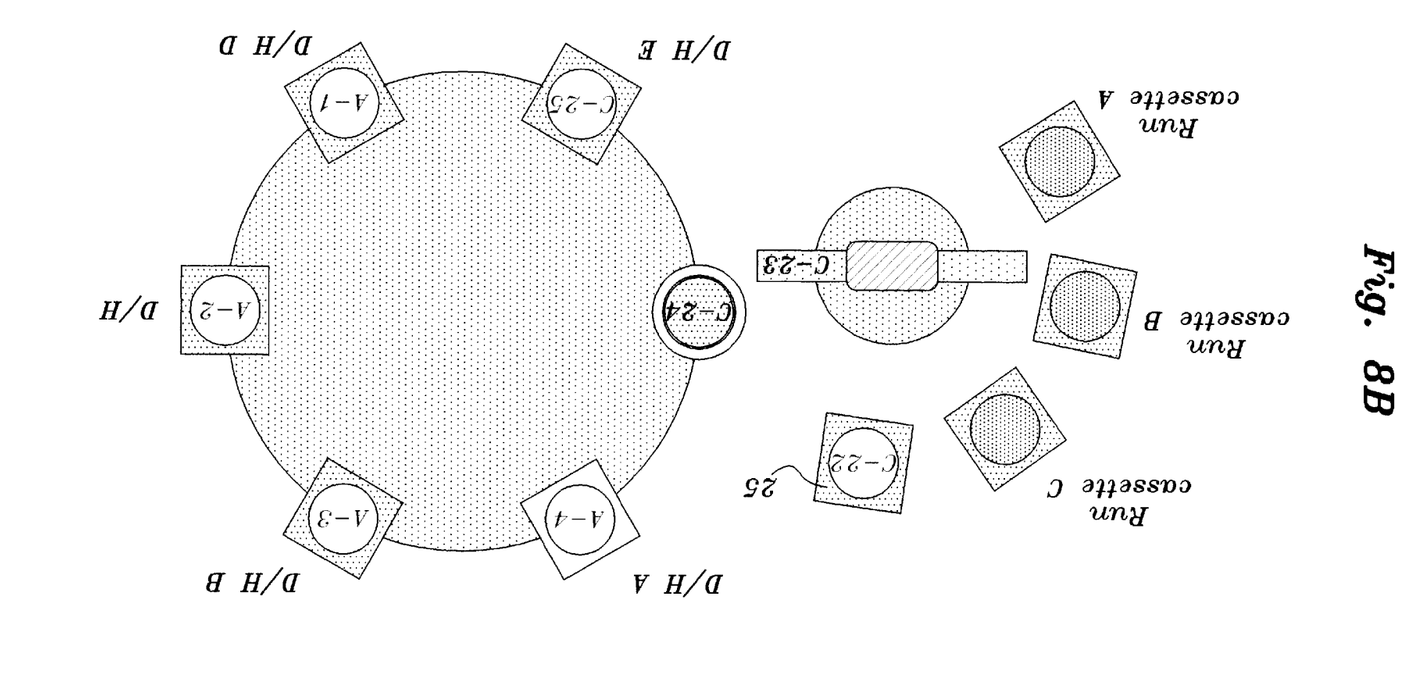
FIG. 8B illustrates a schematic view of a conventional deposition apparatus in a final loaded state which reflects a step in a method of forming films on semiconductor wafers according to a fifth embodiment of the present invention.

Referring now to FIG. 8A, a fourth embodiment of a preferred method of forming films on a plurality of semiconductor substrates will be described. The fourth embodiment is similar to the above described embodiments, however, rather than reloading wafers A1–A4 after all the wafers in run cassette C have been loaded, a new set of wafers from a new run cassette B are loaded. Here, the above described steps are repeated by substituting new cassettes of wafers for cassettes B and C as all the wafers in each cassette are processed. Accordingly, the sequence of processing of cassettes is as follows: $A_1 \rightarrow B_1 \rightarrow C_1 \rightarrow B_2 \rightarrow C_2 \rightarrow B_3 \rightarrow C_3 \rightarrow$ . . . Unfortunately, according to this embodiment, complete processing of cassette A may not be performed until well after processing of cassette A was initiated. To address this limitation, a fifth embodiment of the present invention is provided whereby run cassettes A and B are substituted in alternating sequence after run cassette C has been processed. Accordingly, the sequence of processing of cassettes in the fifth embodiment of the present invention is as follows: $A_1 \rightarrow B_1 \rightarrow C_1 \rightarrow A_1 \rightarrow B_2 \rightarrow C_2 \rightarrow A_3 \rightarrow B_3 \rightarrow C_3 \rightarrow A_3 \rightarrow B_4 \rightarrow C_4 \rightarrow A_4 \rightarrow B_4$ . . . Accordingly, the present invention eliminates the need to use dummy wafers and allows the repeated, efficient and continuous loading of sets of active wafers into a deposition apparatus so that composite films having a final desired thickness can be deposited thereon.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming films on a plurality of semiconductor substrates, comprising the steps of:

loading an apparatus with a first plurality of semiconductor substrates;

depositing a first film of a first material on each of the first plurality of substrates in the apparatus;

removing a first substrate in the first plurality thereof from the apparatus;

depositing a second film of the first material on the first plurality of substrates which have not been removed from the apparatus;

removing a second substrate in the first plurality thereof from the apparatus;

reloading the apparatus with the first substrate in the first plurality thereof; and depositing a third film of the first material on the reloaded first substrate so that the reloaded first substrate includes a composite of the first and third films thereon.

2. The method of claim 1, wherein said step of depositing a third film is followed by the steps of:

reloading the apparatus with the second substrate in the first plurality thereof; and depositing a fourth film of the first material on the first and second reloaded substrates so that the reloaded first substrate includes a composite of the first, third and fourth films thereon and the reloaded second substrate includes a composite of the first, second and fourth films thereon.

3. The method of claim 2, wherein said step of reloading the apparatus with the first substrate in the first plurality thereof is preceded by the step of cooling the removed first substrate; and wherein said step of reloading the apparatus with the second substrate is preceded by the step of cooling the removed second substrate.

4. The method of claim 2, wherein said step of loading the apparatus with a first plurality of wafers comprises loading the apparatus with a first plurality of wafers from a first run cassette; and wherein said step of reloading the apparatus with the first substrate in the first plurality thereof is preceded by the step of loading the apparatus with a second plurality of wafers from a second run cassette, different from the first run cassette.

5. The method of claim 4, wherein the second run cassette comprises N wafers where N is a positive integer; greater than 1 and wherein said step of reloading the apparatus with the first substrate in the first plurality thereof is preceded by the steps of loading the apparatus with the N wafers from the second run cassette.

6. The method of claim 5, wherein the first run cassette also comprises N wafers; and wherein said step of reloading the apparatus with the first substrate in the first plurality thereof is preceded by the steps of loading the apparatus with the N wafers from the first run cassette; depositing a film of the first material on the N wafers from the first run cassette; and then loading the apparatus with at least one wafer from the second run cassette.

7. The method of claim 6, wherein said step of loading the apparatus with the N wafers from the first run cassette comprises sequentially loading each of the wafers from the first run cassette one-at-a-time into the apparatus and depositing films of the first material thereon between each sequential loading step.

8. The method of claim 6, wherein said step of loading the apparatus with at least one wafer from the second run cassette comprises sequentially loading each of the wafers from the second run cassette one-at-a-time into the apparatus and depositing films of the first material on each of the sequentially loaded wafers from the second run cassette.

9. The method of claim 8, wherein the apparatus comprises a chemical vapor deposition chamber; and wherein said step of depositing a first film of a first material on each of the first plurality of substrates is performed at atmospheric pressure in the chemical vapor deposition chamber.

10. A method of depositing films on a plurality of semiconductor wafers, comprising the steps of:

loading a chemical vapor deposition apparatus with a first plurality of semiconductor wafers;

depositing a first film having a first thickness on each of the loaded first plurality of semiconductor wafers;

removing a first wafer in the first plurality thereof from the apparatus;

depositing a second film having a first thickness on each of the loaded first plurality of wafers which have not been removed from the apparatus;

removing a second wafer in the first plurality thereof from the apparatus;

depositing a third film having a first thickness on each of the loaded first plurality of wafers which have not been removed from the apparatus;

loading the apparatus with a second plurality of semiconductor wafers and depositing a film having a second thickness on each of the loaded second plurality of semiconductor wafers;

reloading the first and second wafers from the first plurality thereof into the apparatus after the second plurality of semiconductor wafers have been loaded; and depositing films on the first and second reloaded wafers so that the first and second reloaded wafers include a composite film thereon having a second thickness.

11. The method of claim 10, wherein said step of loading an apparatus with a first plurality of semiconductor wafers comprises loading an apparatus with a first plurality of semiconductor wafers from a first run cassette; and wherein said step of loading the apparatus with a second plurality of semiconductor wafers comprises loading the apparatus with a second plurality of semiconductor wafers from a second run cassette.

12. The method of claim 11, wherein said steps of depositing a film having a second thickness on each of the loaded second plurality of semiconductor wafers and depositing films on the first and second reloaded wafers so that they each include a composite film having a second thickness thereon, are performed at least in part during overlapping time intervals.

13. The method of claim 12, wherein the first and second films have the same thickness and wherein the second thickness is an integer number of times greater than the first thickness.

14. A method of depositing films on a plurality of semiconductor wafers, comprising the steps of:

loading a deposition apparatus having N dispersion heads therein (where N is an integer number) greater than 1 with a first plurality of semiconductor wafers from a first run cassette;

depositing respective first films of different thicknesses on each of the first plurality of wafers;

loading the apparatus with a second plurality of wafers from a second run cassette;

depositing respective films of the same thicknesses on each of the second plurality of wafers;

reloading N–1 of the first plurality of wafers having first films thereon, into the apparatus; and depositing respective second films of different thicknesses on each of the reloaded N–1 wafers having first films thereon, so that each of the first plurality of wafers has a respective composite film thereon of the same thickness.

15. The method of claim 14, wherein said step of loading the apparatus with a second plurality of wafers from a second run cassette begins after commencement of said step of depositing respective first films of different thicknesses on each of the first plurality of wafers;

wherein said step of depositing respective films of the same thicknesses on each of the second plurality of wafers begins after commencement of said step of loading the apparatus with a second plurality of wafers from a second run cassette;

wherein said step of reloading N−1 of the first plurality of wafers into the apparatus begins after commencement of said step of loading the apparatus with a second plurality of wafers from a second run cassette; and wherein said step of depositing respective second films of different thicknesses on each of the reloaded N−1 wafers having first films thereon begins after commencement of said step of reloading the N−1 of the first plurality of wafers into the apparatus.

* * * * *